US011424098B2

(12) United States Patent
Fukuda

(10) Patent No.: US 11,424,098 B2
(45) Date of Patent: Aug. 23, 2022

(54) PATTERN MEASUREMENT DEVICE, AND COMPUTER PROGRAM

(71) Applicant: Hitachi High-Technologies Corporation, Tokyo (JP)

(72) Inventor: Hiroshi Fukuda, Tokyo (JP)

(73) Assignee: Hitachi High-Tech Corporation, Tokyo (JP)

(*) Notice: Subject to any disclaimer, the term of this patent is extended or adjusted under 35 U.S.C. 154(b) by 833 days.

(21) Appl. No.: 16/333,115

(22) PCT Filed: Sep. 29, 2016

(86) PCT No.: PCT/JP2016/078749
§ 371 (c)(1),
(2) Date: Mar. 13, 2019

(87) PCT Pub. No.: WO2018/061135
PCT Pub. Date: Apr. 5, 2018

(65) Prior Publication Data
US 2019/0371568 A1 Dec. 5, 2019

(51) Int. Cl.
*H01J 37/22* (2006.01)
*G01B 15/04* (2006.01)
*H01J 37/28* (2006.01)

(52) U.S. Cl.
CPC ............ *H01J 37/222* (2013.01); *G01B 15/04* (2013.01); *H01J 37/28* (2013.01); *H01J 2237/2817* (2013.01)

(58) Field of Classification Search
CPC .. H01J 37/222; H01J 37/28; H01J 2237/2817; G01B 15/04
(Continued)

(56) References Cited

U.S. PATENT DOCUMENTS 6,170,149 B1 * 1/2001 Oshiki .................. B24B 37/013
29/603.15
7,285,777 B2 * 10/2007 Kawada ................ H01J 37/065
250/307
(Continued)

FOREIGN PATENT DOCUMENTS

JP 2006-215020 A 8/2006
JP 2007-248087 A 9/2007
(Continued)

OTHER PUBLICATIONS

International Search Report (PCT/ISA/210) issued in PCT Application No. PCT/JP2016/078749 dated Dec. 13, 2016 with English translation (three pages).
(Continued)

*Primary Examiner* — Nicole M Ippolito
(74) *Attorney, Agent, or Firm* — Crowell & Moring LLP

(57) ABSTRACT

A purpose of the present invention is to provide a pattern measurement device that allows the selection of device conditions for calculating proper variability and allows the estimation of proper variability. The present invention provides a pattern measurement device comprising a computation processing device that, on the basis of a plurality of measured values acquired by a charged particle radiation device, calculates the variability of the measured values of a pattern that is the object of measurement, said pattern measurement device characterized in that a variability $\sigma_{measured}$ of the plurality of measured values formed at different positions and $\sigma^2_{observed} = \sigma^2_{pattern}/Np + \sigma^2_{sem0}/(Np \cdot Nframe)$ are used to calculate $\sigma_{SEM0}$, which indicates measurement reproducibility error. $\sigma_{pattern0}$ is the variability due to pattern shape error, Np is the number of measurement points, and Nframe is a value that changes according to device conditions.

6 Claims, 10 Drawing Sheets

(58) Field of Classification Search
USPC .................. 250/305, 306, 307, 309, 310, 311
See application file for complete search history.

(56) References Cited

U.S. PATENT DOCUMENTS

| | | | |
|---|---|---|---|
| 7,619,751 B2 | 11/2009 | Yamaguchi et al. | |
| 8,019,161 B2 | 9/2011 | Morokuma et al. | |
| 8,345,263 B2* | 1/2013 | Nakauchi | G01B 11/2441 |
| | | | 356/513 |
| 2006/0145076 A1 | 7/2006 | Yamaguchi et al. | |
| 2007/0221842 A1 | 9/2007 | Morokuma et al. | |
| 2008/0003510 A1* | 1/2008 | Harazaki | G03F 1/36 |
| | | | 430/5 |
| 2012/0324407 A1 | 12/2012 | Matsunawa et al. | |
| 2014/0054469 A1* | 2/2014 | Nishimura | H01J 37/3045 |
| | | | 250/400 |

FOREIGN PATENT DOCUMENTS

| | | |
|---|---|---|
| JP | 4801427 B2 | 10/2011 |
| JP | 4887062 B2 | 2/2012 |
| JP | 2013-4672 A | 1/2013 |

OTHER PUBLICATIONS

Japanese-language Written Opinion (PCT/ISA/237) issued in PCT Application No. PCT/JP2016/078749 dated Dec. 13, 2016 (three pages).

* cited by examiner

[FIG. 2]
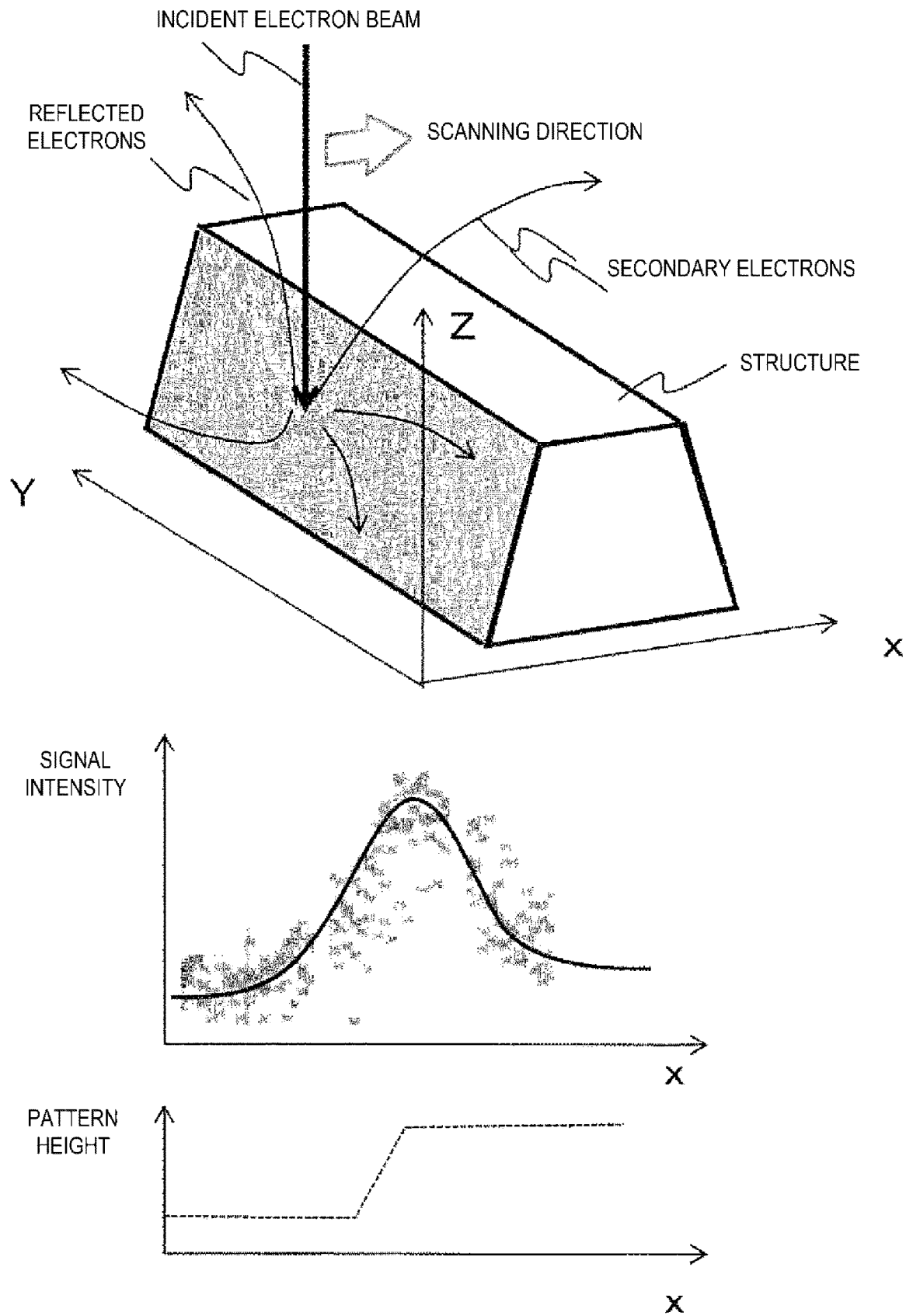

[FIG. 4]
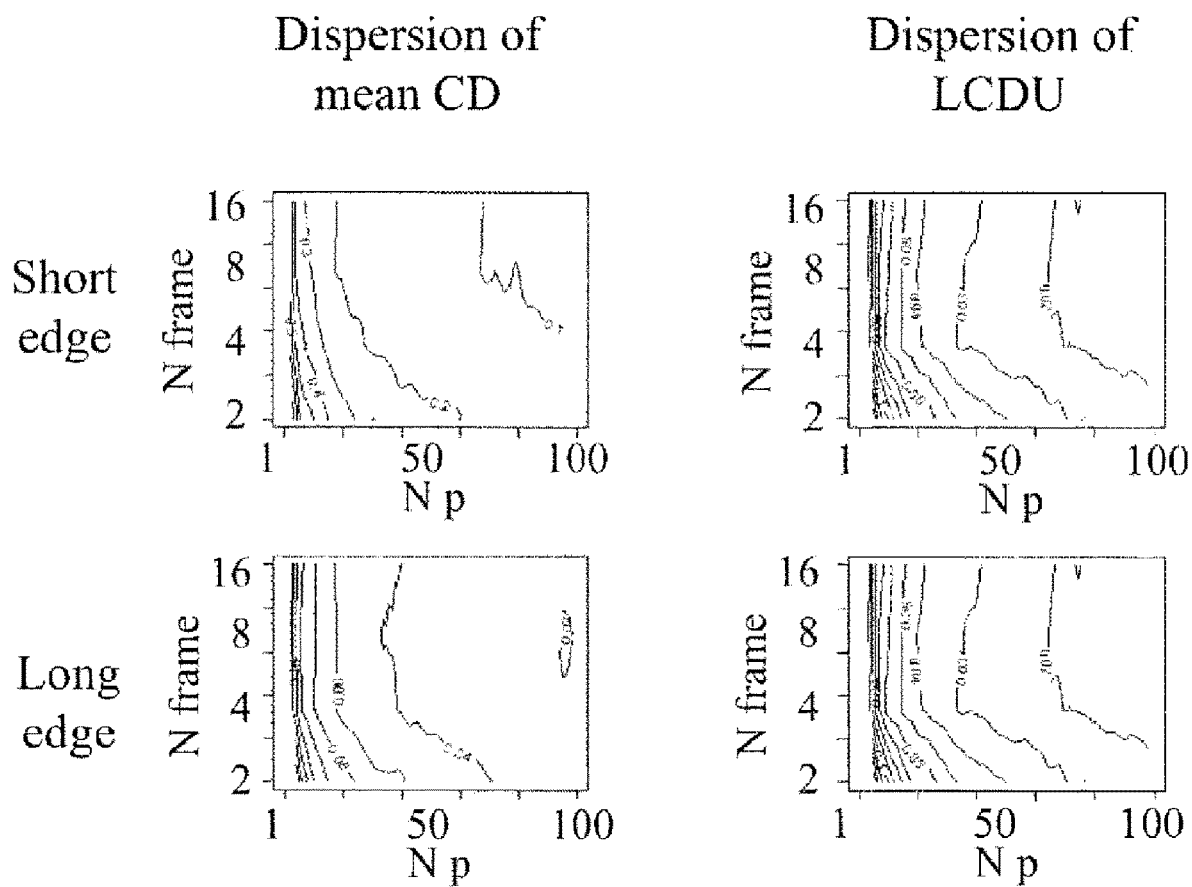

[FIG. 5]
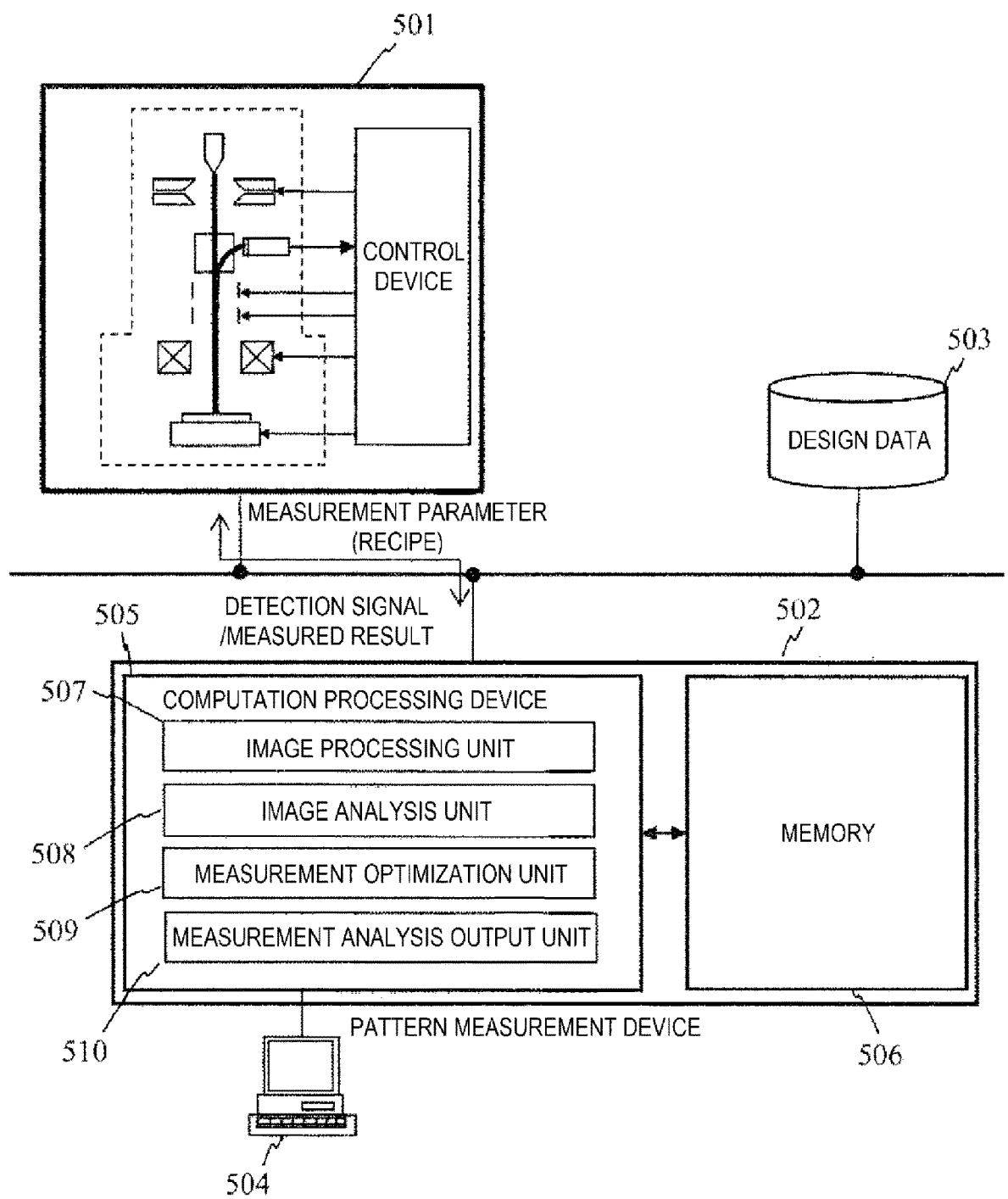

[FIG. 6]
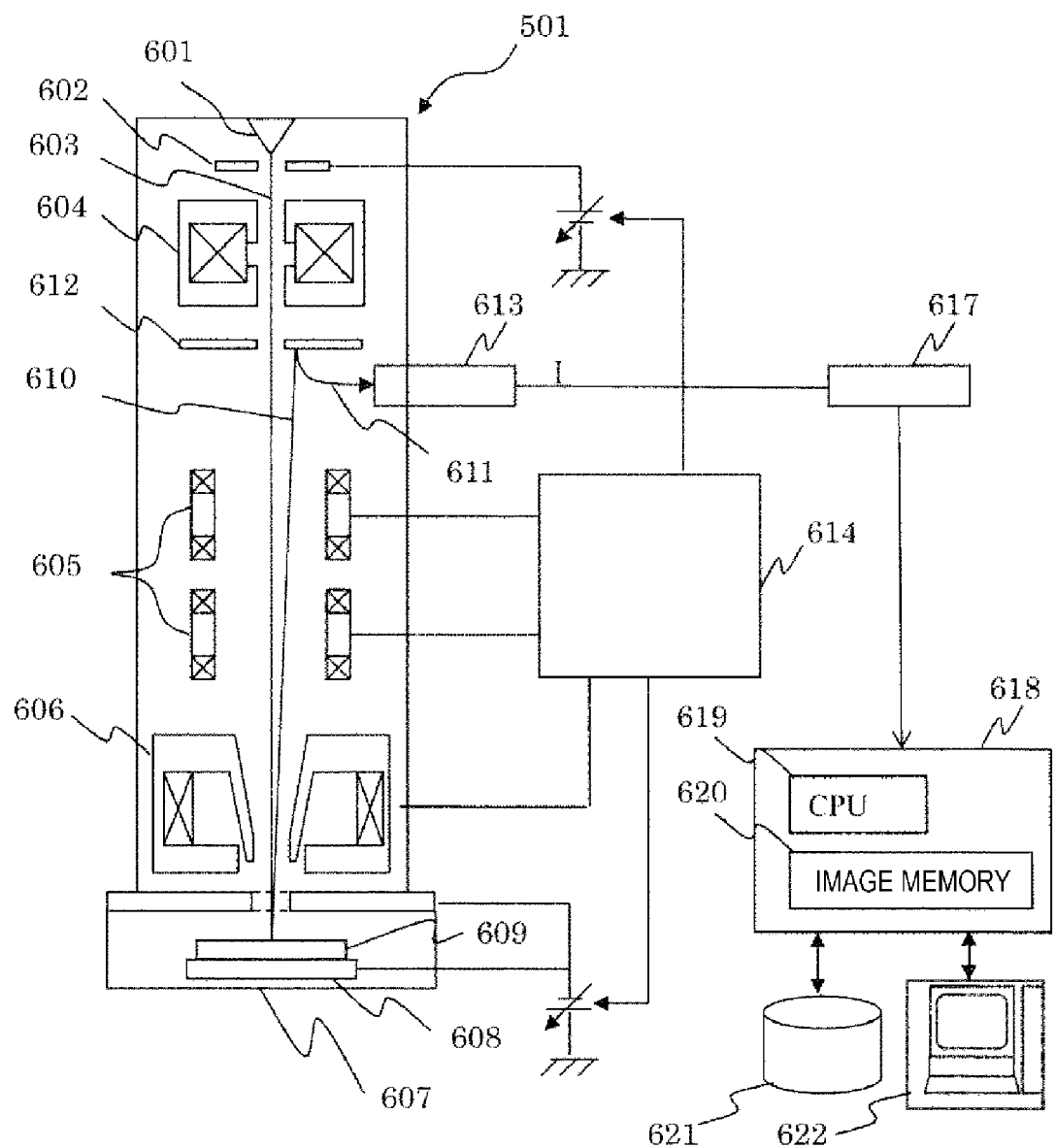

[FIG. 7]
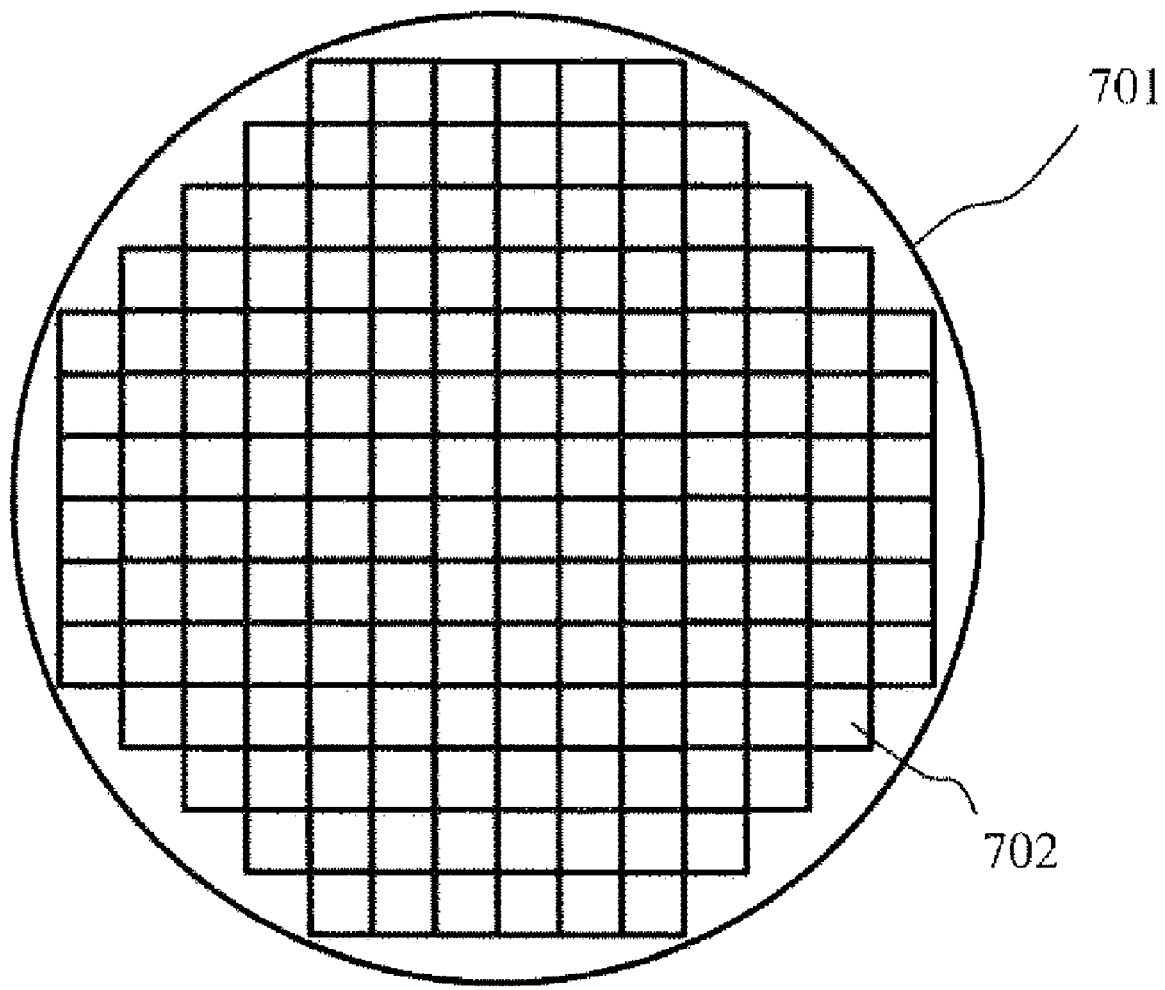

[FIG. 8]
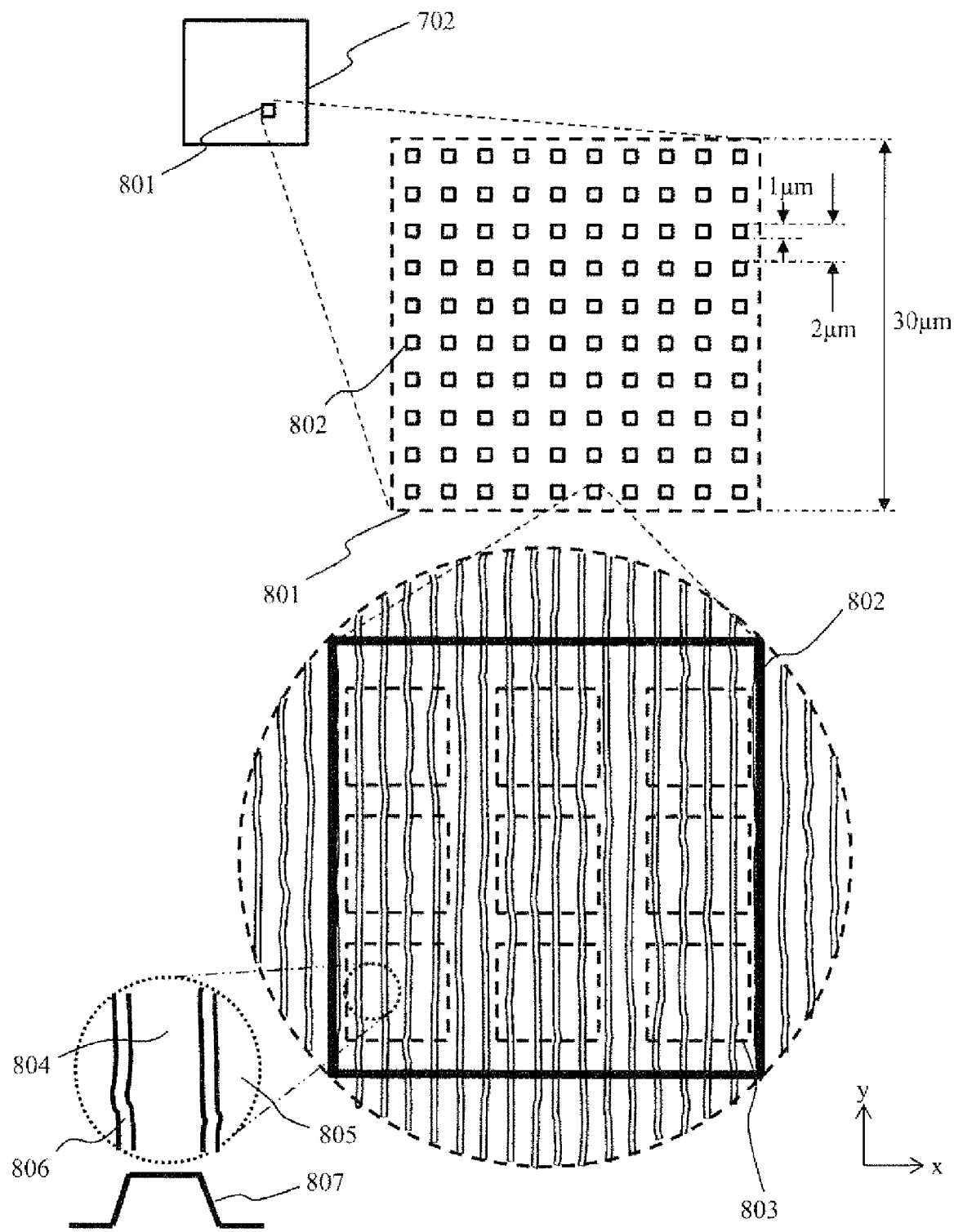

[FIG. 9]
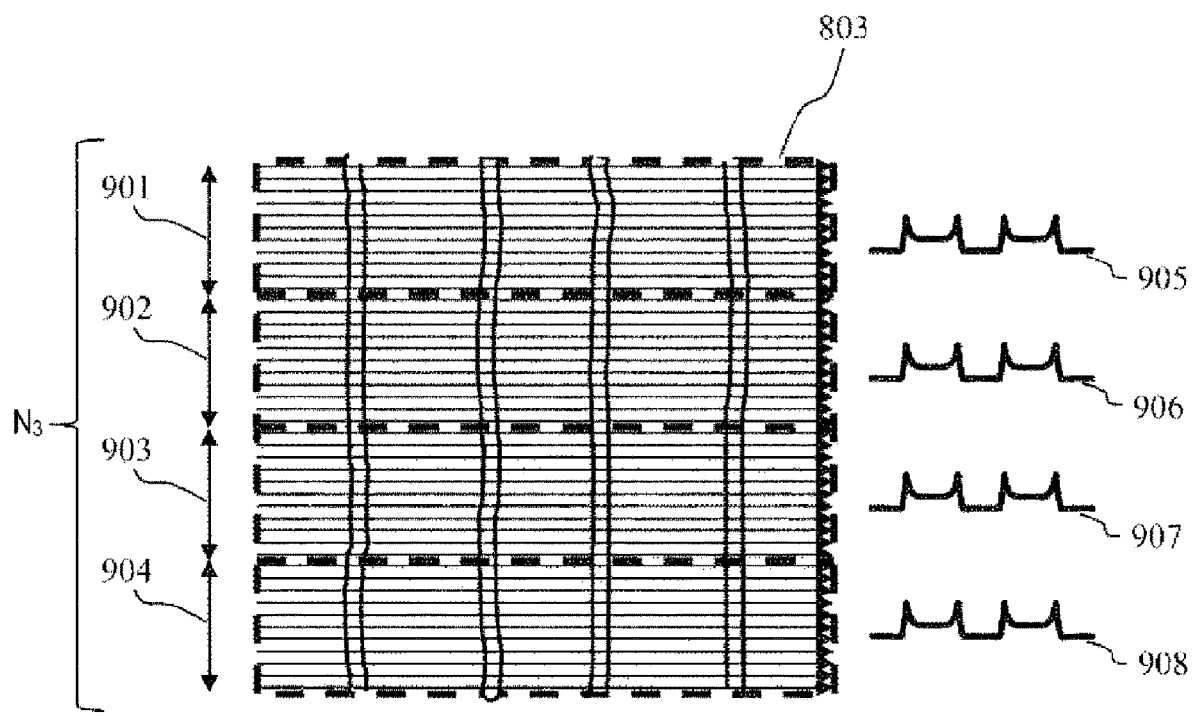

[FIG. 10]
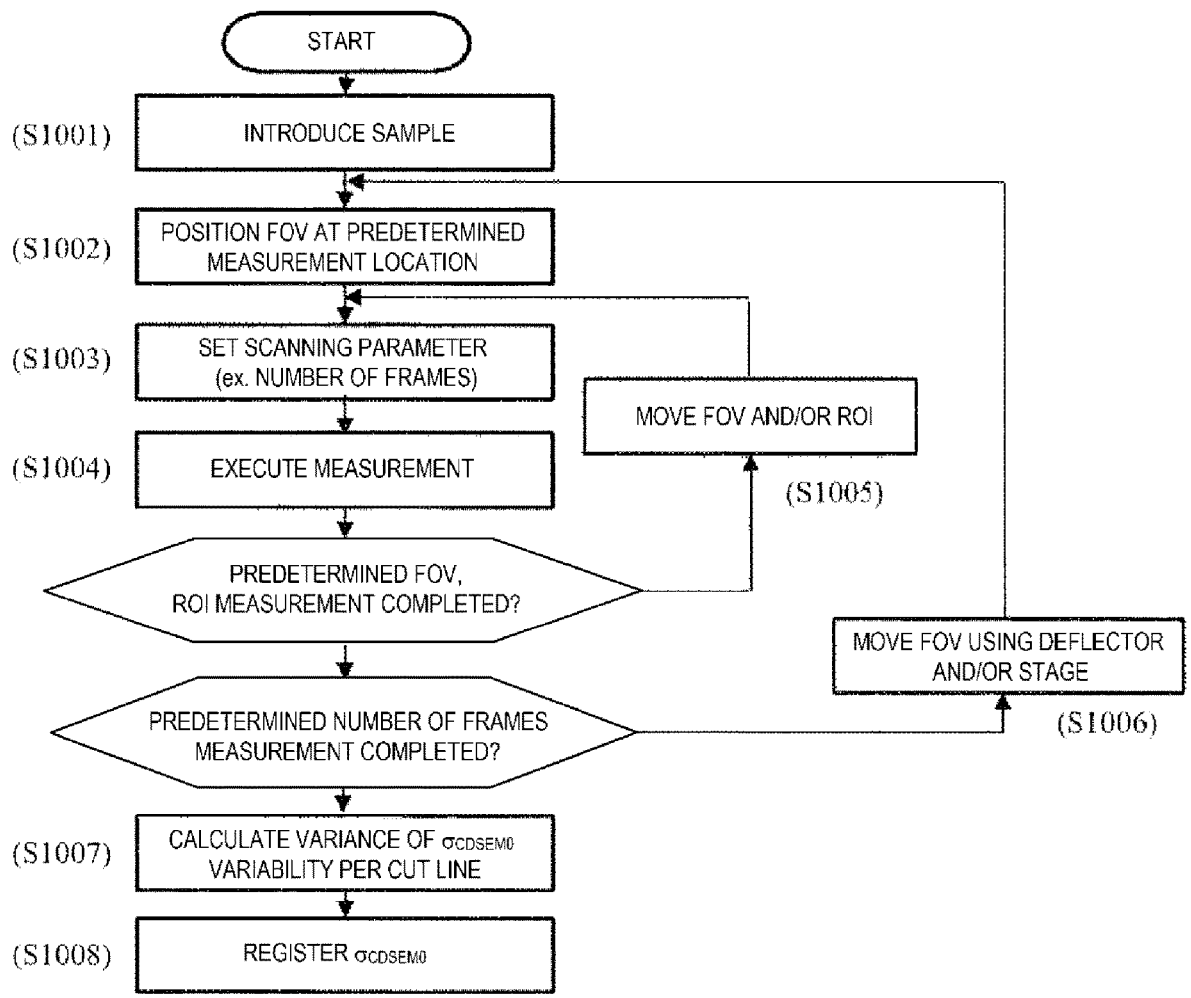

PATTERN MEASUREMENT DEVICE, AND COMPUTER PROGRAM

TECHNICAL FIELD

The present disclosure relates to a measurement device for a pattern formed on a semiconductor device or the like and a computer program that enables a computer to execute measurement processing, and particularly to a pattern measurement device that measures an index value of a pattern such as variability of a pattern shape with high accuracy, regardless of a fluctuation of a measurement error or the like, and a computer program.

BACKGROUND ART

With miniaturization of semiconductor devices, importance of measurement and inspection using a scanning electron microscope (SEM) capable of visualizing a pattern having a width of nanometer order is increasing. Patent Document 1 describes an evaluation method of evaluating unevenness formed on a pattern side wall by using a signal obtained by an SEM. The unevenness is called line edge roughness (LER) or line width roughness (LWR). Proper evaluation is necessary since roughness affects characteristics of a circuit formed on a semiconductor device. Patent Document 2 describes an evaluation method of evaluating a pattern shape by comparing a contour line extracted from an SEM image with a reference pattern generated using design data, and describes an evaluation method of evaluating deviation between corresponding points of the design data and contour line data (Edge Placement Error: EPE) by measuring a distance therebetween.

PRIOR ART LITERATURE

Patent Literature

PTL 1: Japanese Patent No. 4801427 (corresponding to U.S. Pat. No. 7,619,751)
PTL 2: Japanese Patent No. 4887062 (corresponding to U.S. Pat. No. 8,019,161)

SUMMARY OF INVENTION

Technical Problem

As described above, with miniaturization and complication of semiconductor patterns, importance of two-dimensional shape measurement such as roughness evaluation and shape evaluation that uses a plurality of EPE measured results is increasing. On one hand, a measured value obtained by the SEM changes due to various factors. For example, even though a pattern sampled for measurement is accurately measured, it merely means that the pattern as a subject of sampling is accurately measured. Even though process control of a manufacturing device is performed based on the measured result, proper control may not be performed. In addition, in a case of a SEM that detects electrons obtained based on scanning of an electron beam, it is not always possible to form exactly the same signal waveform even if the same pattern is measured. This is because, for example, an emission direction of electrons emitted from a sample is random and varies from measurement to measurement. As a result, the measured result used to perform proper process control may not be obtained.

As described above, there is measurement variability intrinsic to a device such as the SEM. An index value that indicates a pattern shape includes, in a mixed manner, and variability due to a fluctuation of the measured result (fluctuation of the measurement error), and a true shape change (shape variability) of the pattern to be evaluated. This makes it difficult to evaluate the pattern shape properly. Patent Documents 1 and 2 do not refer to reducing an influence on the measured result of the variability due to the fluctuation of the measurement error as described above.

Hereinafter, a pattern measurement device and a computer program are provided. The pattern measurement device allows at least one of selection of device conditions for calculating proper variability and estimation of the proper variability.

Solution to Problem

As one mode for achieving the above aim, hereinafter, a pattern measurement device is proposed. This device includes an computation processing device that, on the basis of a plurality of measured values acquired by a charged particle radiation device, calculates the variability of the measured values of a pattern that is the object of measurement. The pattern measurement device is characterized in that a variability $\sigma_{measured}$ of the plurality of measured values formed at different positions and $\sigma^2_{observed} = \sigma^2_{pattern0}/Np + \sigma^2_{sem0}/(Np \cdot Nframe)$ are used to calculate $\sigma_{SEM0}$, which indicates measurement reproducibility error. $\sigma^2_{pattern0}$ is the variability due to pattern shape error, Np is the number of measurement points, and Nframe is a value that changes according to device conditions.

Advantageous Effect

According to the above configuration, it is possible to select the device conditions for calculating proper variability or properly estimate the variability.

BRIEF DESCRIPTION OF DRAWINGS

FIG. 2 is a diagram showing a relationship between signal electrons emitted by a beam incidence on a pattern and a pattern shape.

FIG. 4 is a diagram showing a relationship between variability specified by pattern measurement and factors causing the variability.

FIG. 5 is a diagram showing an example of a semiconductor measurement system.

FIG. 6 is a diagram showing an outline of a scanning electron microscope.

FIG. 7 is a diagram showing an example of a semiconductor wafer to which a resist pattern is transferred.

FIG. 8 is a diagram showing a state in which measurement points are assigned to a plurality of chips of the semiconductor wafer.

FIG. 9 is a diagram showing a measurement region (length measurement region) assigned within a field of view of the scanning electron microscope.

FIG. 10 is a flow chart showing measurement processing steps by the SEM.

DESCRIPTION OF EMBODIMENTS

In the manufacturing process of electronic components such as semiconductor integrated circuits and high-frequency elements, patterns of electronic components such as a large number of transistors and memory elements, and patterns of circuits that connect the above elements are formed on a substrate such as a semiconductor substrate or on various types of thin films on the substrate, by using lithography and etching techniques. A dimension of each of the above elements and circuits in a most miniaturized leading-edge device reaches 10 nm, and is expected to be further reduced in the future. Since performance of the electronic components largely depends on planar shapes of the elements or circuits, it is desirable in general to form the planar shapes with accuracy of about 1/10 to 1/3 of a design dimension of a pattern.

However, due to various factors, a deviation actually occurs between a pattern of an element or circuit that is actually manufactured and a design pattern. Such a deviation can be handled quantitatively by evaluating an edge of the pattern of the element or circuit actually manufactured and a deviation of edge placement (EPE) where the pattern should originally exist. Factors causing EPE are classified into the following three types.

The three types of factors are: (1) a deviation of an average pattern dimension, as well as a dimensional change of overall thickening and thinning; (2) a deviation of an average or central pattern position, as well as overall position deviation; and (3) a local fluctuation of a pattern edge or pattern dimension.

(1) is caused by thinning and thickening of a resist pattern dimension transferred by an exposure device, and side etching. (1) can be corrected by adjusting exposure conditions such as exposure amount and focus position and process conditions such as etching. (2) is caused, for example, by misalignment between an underlying pattern and a mask transfer image by the exposure device, and can be corrected by adjusting an alignment of the exposure device. (3) is considered to be caused by random or local fluctuation of edge positions, which is difficult to control by the above-described methods. For example, it is considered to be caused by probabilistic variability of chemical reactions or dissolution phenomena in materials in an intermediate region of exposure intensity in the vicinity of an edge of a projected image. The amplitude of the variability reflects, for example, a width of an intermediate exposure amount range, that is, sharpness of an exposure profile (defocus condition and the like). Accordingly, the amplitude changes depending on the contrast of effective projected image and can be controlled to some extent.

Figure 3A:
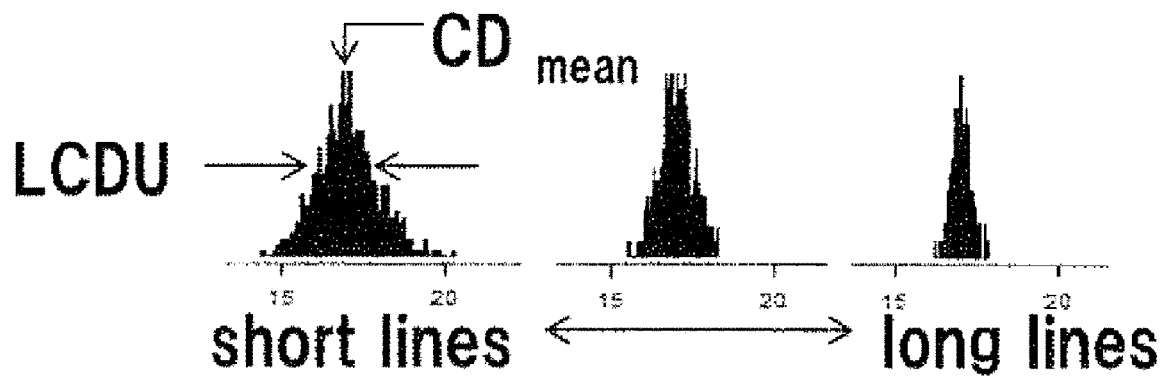
FIGS. 3A and 3B are diagrams showing a relationship between a pattern length (for example, a length in an edge direction of a line pattern) and variability of signals.

Deviations of (1) to (3) described above vary with spatial and temporal fluctuations, and an influence on element performance depends on a relationship between a spatial period of the variability and the element dimension. When a fluctuation period is smaller than the element dimension, the fluctuation causes deterioration in the element performance itself. When the fluctuation period is larger than the element dimension, the fluctuation causes element performance variability. Although a fluctuation spatial period of (3) is smaller than those in (1) and (2) in general, an influence of (3) with a small spatial period on the element performance variability becomes obvious with the progress of miniaturization. FIG. 3(a) shows variability of average widths of line patterns having different lengths. It shows that the shorter a noticed line length is, the larger the variability of a line width due to (3) becomes.

In order to suppress the deviation due to the manufacturing process and materials, it is required to correctly measure a pattern dimension and shape, accurately figure out a distribution in a wafer surface and a local fluctuation of dimension, and correct the process conditions and a device knob.

In order to suppress the deviation due to the manufacturing process and materials as described above, it is required to accurately measure the pattern dimension and shape, accurately figure out the distribution in the wafer surface and the local dimensional fluctuation, and to correct the process conditions and the equipment knob. Therefore, measurement reproducibility in pattern measurement using SEM is important.

However, there exists a reproducibility error in pattern measurement by SEM. A main factor of the reproducibility error is particle nature of electrons. FIG. 2 schematically shows a principle of edge position measurement of a line pattern by the SEM. In general, secondary electrons and backscattered (reflected) electrons emitted from a sample are detected by scanning a focused electron beam in a direction (x direction) perpendicular to an edge direction (y direction). A signal intensity profile is obtained by plotting a relationship between an irradiation position (x coordinate) of the electron beam and a detected signal.

Since the signal intensity becomes maximum when the electron beam is incident on the vicinity of the edge, the edge position can be defined by, for example, setting an proper threshold value with respect to the relative signal intensity. However, when detecting secondary electrons or reflected electrons, in each process, incident positions of electrons, scattering and reflection directions inside the sample, generation of secondary electrons, and the like are is stochastic. This results in variability of the signal intensity profile. Therefore, the edge position obtained from the profile also varies. According to the central limit theorem, when calculating statistics of a plurality of sample groups formed by extracting n measurement objects from a population of an average value A and a variance $\sigma^2$, an average of average values of the plurality of sample groups is A and a variance is $\sigma^2/n$. Therefore, a variability $\sigma\_measurement$ of a result (average value of distributions) obtained when the same object is repeatedly measured strictly by a measuring device having a normal distribution of a standard deviation $\sigma$ as a reproducibility error, is $\sigma\_measurement=\sigma/\sqrt{n}$. Therefore, by increasing the number of measurements n, measurement reproducibility is improved.

However, actually, objects of the same design shape formed at different positions are often measured for several reasons as described below. First of all, when the measurement is repeated at the same place, the measured results may change due to sample damages (contamination or shrink). In order to suppress contamination and shrinkage while increasing the number of measurements for high accuracy measurement, it is necessary to change the position. Second, in general, even with the same design pattern, the actual shape varies with positions. In this case, even if a complete measurement is performed for a certain pattern, only a true value at one point of the variability is calculated. Therefore, in order to calculate a statistical average of a design shape of a measurement object, it is necessary to measure a plurality of samples and calculate an average thereof. Third, it is often desirable to specify variability magnitude of the same design pattern shape depending on the positions, or the distribution of shape changes. Changes with positions include various factors such as a fluctuation from wafer to wafer, distribution within a wafer, distribution within a chip, and a dimensional fluctuation in a local region. In this case, it is needless to say that measurement is performed at a plurality of places.

In a semiconductor manufacturing process, a processing device is controlled based on a change in an average shape of an object pattern. However, as described above, when measurement is performed for a plurality of times at different positions, variability of the measured results includes, in a mixes manner, variability due to measurement reproducibility error and true shape variability. Accordingly, it is sometimes impossible to judge whether the change of the measured results is caused by the change of true pattern change.

When dimensions, shapes, and local variations thereof are measured at a plurality of places in a wafer surface or in a chip, and the processing device is controlled so that distributions of these parameters fall within an allowable range, it is sometimes impossible to judge whether the difference between the measured ideal shape and the actual pattern reflects the difference of the true shapes. In either case, in order to perform reliable process control, it is required that the reproducibility error during repeated measurement is sufficiently small compared to the difference in measured results due to the true variability of the shapes to be measured.

In the embodiments described below, in order to handle the variability and the like quantitatively, a plurality of feature amounts are modeled as follows. The embodiments consider a large number of the same design patterns that exist in a predetermined region on a wafer as a population. N patterns are sampled from the above population to measure the dimension and shape thereof, and an average value and variability are calculated from a distribution of the measured results as feature amounts. The feature amounts dealt with in the embodiments described below are an average of average values of the measured results (CD center value), a variance of the average values of the measured results (measurement reproducibility error of the CD center value), an average value of variances of the measured results (average of variabilities of CD=CDU or LCDU) and a variance of the variances of the measured results (measurement reproducibility error of CDU or LCDU). The CD is, for example, a measured value of a line width of a pattern. In order to calculate the true shape variability, it is required to make the CD center value and CDU and LCDCD as close to those of the population as possible, and to make the measurement reproducibility error as close to 0 as possible.

The measured result output from the measurement device varies with two factors including a variability σ_pattern due to the variability of the object pattern shape itself and a variability σ_sem due to the measurement reproducibility error. Here, since both are independent from each other, a variance $\sigma^2$_observe observed as a result of the measurement is a sum of the variance of the both factors. That is, it may be expressed as $\sigma^2$_observed=$\sigma^2$_pattern+$\sigma^2$_sem.

Hereinafter, a method of accurately estimating a population σ_pattern from σ_observed by separating factors of the variability into two items will be described.

In the embodiments described below, an index value that indicates the true variability is mainly calculated through the following steps. First, the number of measurement points (or the number of independent detected edge points in a beam scanning and measurement region) and the number of measurements per measurement point (or beam scanning and measurement conditions) are variously changed, the measurement is repeated for a plurality of times for each device condition such as the number of beam scans, and a variability distribution of the obtained measured result is calculated (step 1). Next, dependency of the variability magnitude to the beam scanning and measurement condition (or the number of measurements) and the number of independent detected edge points (or the number of measurement points) are calculated. The dependencies are expressed as follows: variability=(item depending on the number of measurement points (or independent detected edge number))× (constant+item depending on the number of measurements per measurement point (or beam scanning and measurement condition)) (step 2). Finally, based on the above relational expression, (1) a minimum beam scanning and measurement condition necessary to suppress the variability to the required range with a minimum number of detected edge points is set, or (2) the magnitude of the true variability is specified by the above (item depending on the number of independent edge points*constant) (step 3).

Here, the beam scanning and measurement condition are given by a beam condition that includes the number of frames or a current amount. The number of independent detected edge points is given by, for example, the number of measurement edges, and measurement edge length/an scanning line interval.

Specifically, in the above method, for example, when a true pattern edge variability is calculated from an observation variability, based on a signal obtained on the basis of beam scanning, $\sigma^2_{observed}$ that indicates the variability of the feature amount of a pattern included in the sample is calculated. $\sigma^2_{observed}$ is assigned into $\sigma^2_{observed} = \sigma^2_{CD}/\text{\#cut line} + \sigma^2_{sem}/\text{\#cut line} \cdot \text{\#frame}$, thus $\sigma^2_{CD}$ is calculated. $\sigma_{CD}$ is the variability after excluding variability due to fluctuations of measurement errors. The true shape variability can be specified by outputting $\sigma_{CD}$ or a parameter that varies according to $\sigma_{CD}$ and is calculated from $\sigma_{CD}$. $\sigma^2_{CD}$ is an index value that indicates the true variability of the measurement object, and $\sigma^2_{sem}$ is a variability that changes according to the device conditions of the electron microscope. #cut line is a value that changes according to the edge length, and #frame is a value that changes according to the beam condition (device condition) such as the number of frames.

The variance of the variability centered on the average value of the object pattern shape is inversely proportional to the magnitude of the extracted sample. In contrast, the variance of the variability due to the measurement reproducibility error is not only inversely proportional to the magnitude of the extracted sample, but also inversely proportional to the number of measurements. In the embodiments described below, the variability due to the shape is selectively extracted using such a phenomenon. More specifically, when the pattern dimension or shape is measured using the SEM, a large number of measurement objects that exists in a predetermined local region and have the same design are defined as a population, and a plurality of objects (samples) are selected from the population. The pattern dimension or shape is measured for a plurality of times, and the average and variance of the measured results are calculated. The purpose of the embodiments described below is to make the average and variance of the samples as close to the average and variance of the population as possible with as few samples as possible. As a result of examination based on the experiment results of the inventor, the following relationship is clarified. First, the experiment results are described.

First, a pattern was exposed on a semiconductor wafer coated with a predetermined resist through a mask containing a large number of identical patterns. At that time, exposure was performed so that exposure regions of one shot were arranged in a matrix form. The pattern formed by the exposure was imaged by a SEM. A field of view (FOV) of the SEM was set such that it includes a line and space pattern. At a plurality of different positions along a pattern edge direction (y direction), the electron beam was scanned in a direction (x direction) perpendicular to the edge. This allowed two-dimensional signal intensity distributions at the plurality of different positions to be acquired A plurality of SEM images were acquired by changing the number of scans for the same imaging region, that is, the number of frames. Next, for each SEM image, a plurality of measurement boxes were set for the pattern, so that a pattern dimension in the measurement boxes was measured. At this time, conditions such as a measurement box length and the number of measurement boxes in the FOV were changed variously. Specifically, within the measurement boxes, the pattern dimension was calculated (here, a proper averaging process may be performed) from a signal intensity distribution along a cut line in a direction (x direction) perpendicular to the above edge at a plurality of positions separated by a fixed distance in the pattern edge direction (y direction). Dimensions for all the cut lines in the measurement boxes were averaged and output as the pattern line width in the measurement boxes. A statistical distribution of the line widths calculated for the plurality of measurement boxes was calculated and a standard deviation of the variability was calculated.

The SEM images were acquired by variously changing the number of frames (N frames) at a plurality of positions in a line and space type resist pattern formed on the semiconductor wafer. Next, Np different plural positions were extracted along the pattern edge direction (y direction), cut lines were set in the direction (x direction) perpendicular to the above edge, the pattern dimension was calculated from electron beam signal intensity profiles obtained along the cut lines, and an average value and a standard deviation thereof were calculated from a distribution of the dimensions for Np cut lines.

The average value and the standard deviation represent the average dimension and the LER of the pattern. This procedure was repeated, and dependency of the obtained average dimension and the LER distribution to the number of cut lines Np and the number of frames Nframe were examined. The results are shown in FIG. 1(a).

Figure 1A:
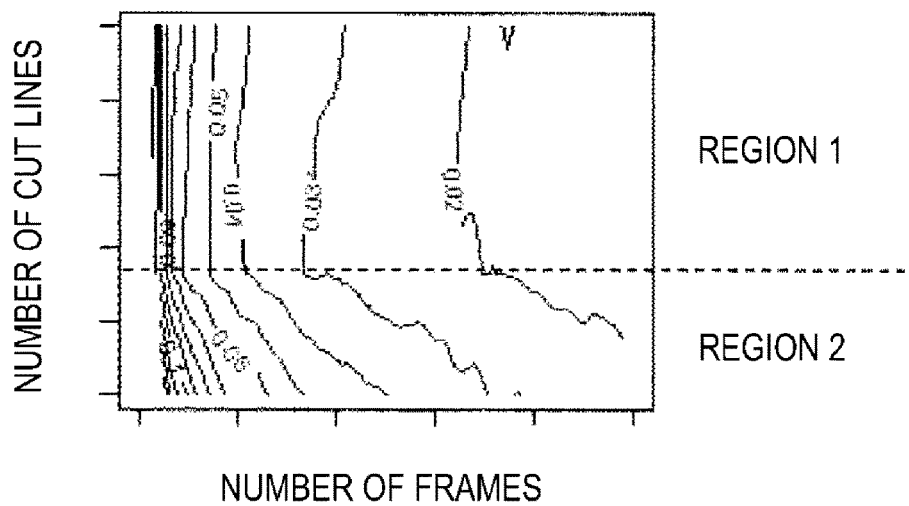
FIGS. 1A and 1B are diagrams showing a relationship between variability specified by pattern measurement and factors causing the variability.

As shown in FIG. 1(a), it was shown that the variability is divided into two regions: a region (region 1) that depends only on the number of cut lines without depending on the number of frames, and a region (region 2) that depends on both the number of cut lines and the number of frames. That is, the variance $\sigma^2_{observed}$ of the observed variability is expressed by the following expression.

$$\sigma^2_{observed} = \sigma^2_{pattern0}/Np + \sigma^2_{sem0}/(Np \cdot \text{Nframe}) \quad \text{[Expression 1]}$$

Figure 1B:
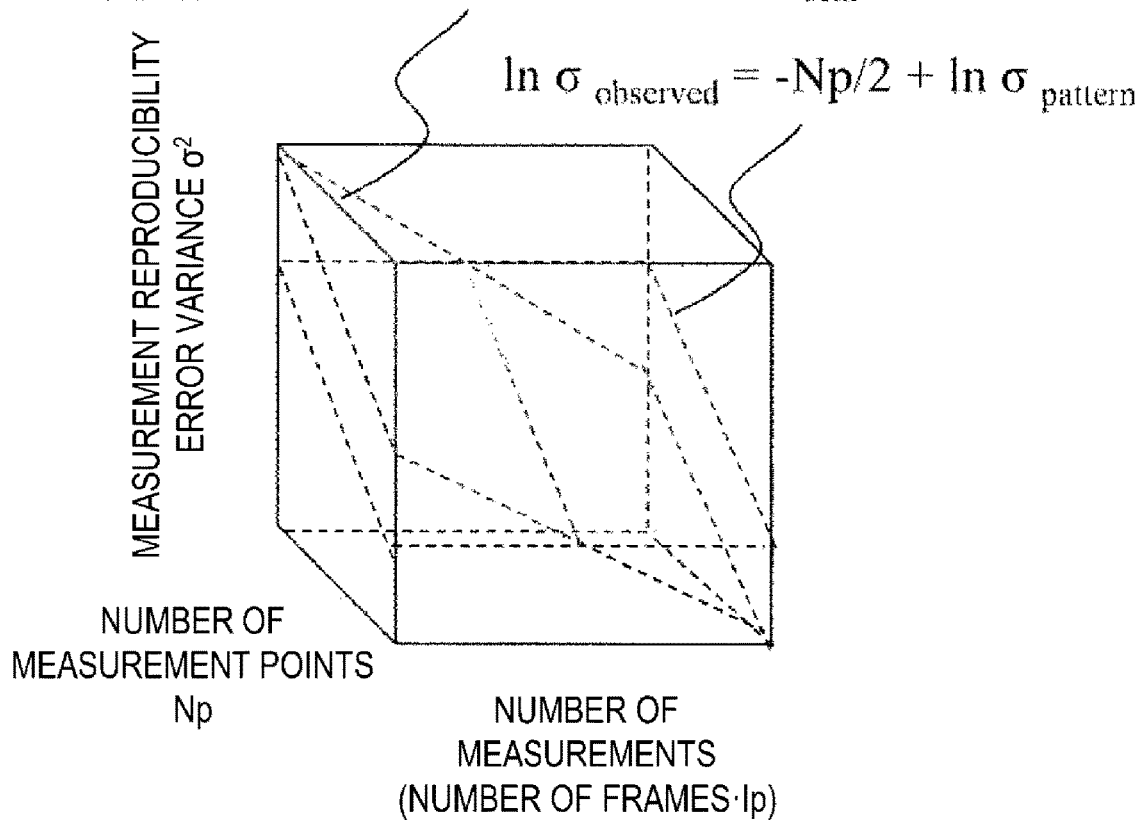

The region 1 corresponds to a case when Nframe is large and the second item can be ignored compared with the first item. On the other hand, the region 2 corresponds to a case where the second item is dominant. FIG. 1(b) schematically shows dependency of two items of the expression to the number of cut lines and the number of frames.

Next, the meaning of the expression will be described. The reason why the relationship can be expressed by the expression can be expressed by the above expression can be considered as follows.

The variance of the measured result includes both the variability of the object pattern shapes, that is, spatial variability, and the variability due to the measurement reproducibility error, that is, time variability. Factors of the variability due to time include (1) stochastic variability due to the particle nature of electrons (such as incident electron number, incident position and scattering process), (2) changes of the measurement object by electron-material interaction (such as sample damages), and (3) system noises of the measurement device.

(1) is caused by the generation principle of secondary electrons and the like as described above, and $\sigma_{sem}$ that indicates the degree of the contribution thereof is expressed as follows by the number of incident electrons Ne per unit length in electron beam scanning.

$$\sigma^2_{sem} \propto (1/Ne) \quad \text{[Expression 2]}$$

Since the number of incident electrons Ne is proportional to the number of frames Nframe and the probe current Ip, Ne can be expressed as:

$$\sigma^2_{sem} \propto (1/\text{Nframe}) \propto (1/Ip) \quad \text{[Expression 3]}$$

Meanwhile, in a case of measuring an object that exists in another position, the measured result varies with the spatial variability, and at the same time the measurement is inevitably performed at a different time. Therefore, the variability due to the time is included. At this time, since the spatial variability $\sigma_{pattern}$ of the measurement object and the measurement variability $\sigma_{sem}$ depending on time are independent, $$\sigma^2_{observed} = \sigma^2_{pattern} + \sigma^2_{sem} \quad \text{[Expression 4]}$$

both $\sigma_{pattern}$ and $\sigma_{sem}$ depend on the number of measurement points Np according to the central limit theorem. That is:

$$\sigma^2_{pattern} = \sigma^2_{pattern0}/Np \quad \text{[Expression 5]}$$

$$\sigma^2_{sem} = \sigma^2_{sem0}/(Np \cdot \text{Nframe}). \quad \text{[Expression 6]}$$

Therefore, $$\sigma^2_{observed} = \sigma^2_{pattern0}/Np + \sigma^2_{sem0}/(Np \cdot \text{Nframe}). \quad \text{[Expression 7]}$$

When the beam current Ip changes, or when a change due to system noises and the like cannot be ignored, parameters that indicate these contributions are added to the above expression, that is:

$$\sigma^2_{observed} = \sigma^2_{pattern0}/Np + \sigma^2_{sem0}/(Np \cdot \text{Nframe})(I_0/Ip) + \sigma^2_{noise}. \quad \text{[Expression 8]}$$

However, $\sigma_{sem0}$ is a coefficient for the beam current $I_0$.

When the number of scans is increased, the dimension or shape may be changed by the sample damages due to the electron beam and the measured value may be shifted. Dimensional shift due to such damages is deterministic as a function of the number of scans and is not the measurement variability, so it is desirable to subtract from the measured results in advance.

By quantifying the degree of the contribution of the measurement reproducibility error in the pattern dimension and shape measurement using a SEM, it is possible to set the measurement conditions (optimization of the device conditions) that can reduce the measurement error, and to extract the true shape evaluation value with the measurement error separated. Therefore, it is possible to control and manage various manufacturing devices and manufacturing processes with high reproducibility within an actual time range by high accuracy and reproducibility measurement using electron beams. The production yield of various semiconductor devices and electronic components can be improved, and the performance thereof can be maintained and improved.

Hereinafter, a measurement device that measures a pattern formed on a semiconductor device, a computer program that enables a computer to execute pattern measurement, and a storage medium that stores the program will be described with reference to the drawings.

FIG. 5 is a diagram showing an example of a measurement system including a pattern measurement device 502 that measures a pattern based on measured results obtained by a SEM 501. FIG. 5 shows an example in which the SEM 501 that serves as an imaging system and a computation processing unit 505 (pattern measurement unit 502) that executes the measurement processing are connected via a network based on a detection signal. However, the present invention is not limited thereto. For example, an image processing unit 618 included in the scanning electron microscope shown in FIG. 6 to be described below may perform calculation processing to be described below. The system exemplified in FIG. 5 includes the SEM 501, the pattern measurement device 502 that executes pattern measurement and the like based on the obtained signal, a design data storage medium 503 in which design data of a semiconductor device or layout data generated based on the design data are stored, and an input device 504 having a display unit.

FIG. 6 is a diagram showing an outline of the SEM 501. An electron beam 603 is extracted from an electron source 601 by an extraction electrode 602 and accelerated by an acceleration electrode (not shown). The accelerated electron beam 603 is constricted by a condenser lens 604 that serves as one form of a focusing lens and then deflected by a scanning deflector 605. Accordingly, the electron beam 603 scans a sample 609 one-dimensionally or two-dimensionally. The electron beam 603 incident on the sample 609 is decelerated by a negative voltage applied to an electrode built in a sample stage 608 and is focused by lens action of an objective lens 606. A surface of the sample 609 is irradiated by the electron beam 603.

Electrons 610 (such as secondary electrons and backscattered electrons) are emitted from an irradiated portion on the sample 609. The emitted electrons 610 are accelerated in a direction of the electron source 601 by acceleration action based on the negative voltage applied to the electrode built in the sample stage 608. The accelerated electrons 610 collide with a conversion electrode 612 to generate secondary electrons 611. The secondary electrons 611 emitted from the conversion electrode 612 are captured by a detector 613, and an output I of the detector 613 is changed according to a captured secondary electron amount. Luminance of a display device changes in accordance with a change of the output I. For example, when a two-dimensional image is formed, a deflection signal to the scanning deflector 605 and the output I of the detector 613 are synchronized to form an image of the scanning region.

The SEM exemplified in FIG. 6 shows an example in which the electrons 610 emitted from the sample 609 are detected by one end conversion to secondary electrons 611 at the conversion electrode 612. However, of course, the invention is not limited to such a configuration. For example, a configuration may be adopted in which an electron multiplier tube or a detection surface of the detector is disposed on an orbit of the accelerated electrons. A control device 614 supplies necessary control signals to each optical element of the SEM according to an operation program for controlling the SEM called an imaging recipe.

Next, the signal detected by the detector 613 is converted into a digital signal by the A/D converter 617, and sent to the image processing unit 618. The image processing unit 618 generates integrated images by integrating signals obtained by a plurality of scans with a frame unit. For example, in a case of integrating images of eight frames, an integrated image is generated by performing averaging process on signals obtained by eight two-dimensional scans in a pixel unit.

The image processing unit 618 further includes an image memory 620 that serves as an image storage medium for temporarily storing digital images, and a CPU 619 that calculates feature amounts (dimensional values of lines and holes, roughness index values, index values that indicate pattern shapes, area values of patterns, pixel positions as edge positions, and the like) from the images stored in the image memory 620.

Furthermore, the image processing unit 618 includes a storage medium 621 that stores measured values of each pattern, luminance values of each pixel and the like. The overall control is performed by a workstation 622, and necessary operation of the device, confirmation of the detected results and the like can be realized by a graphical user interface (hereinafter referred to as GUI). In addition, the image memory is configured to store an output signal of the detector (signal proportional to the amount of electrons emitted from the sample) in synchronism with a scanning signal supplied to the scanning deflector 605 at an address (x, y) on a corresponding memory. The image processing unit 618 also functions as a computation processing unit that generates line profiles from the luminance values stored in the memory, identifies edge positions using a threshold method and the like, and measures the dimension between edges. The SEM that performs dimension measurement based on such a line profile acquisition is called CD-SEM and is used for measuring various feature amounts in addition to line width measurement of a semiconductor circuit. For example, unevenness called line edge roughness exists on the edge of the circuit pattern, which causes a change in circuit performance. The CD-SEM can be used for the measurement of the LER.

The LER is calculated by converting the extent of the deviation of the actual edge position with respect to the average position of the edge position in the x direction (for example, a scanning line direction of the electron beam) into an index value.

Hereinafter, a method of adjusting and measuring the device based on the detection signal obtained by the SEM will be described in detail.

First Embodiment

The present embodiment describes an example in which the number of samples and imaging conditions necessary for obtaining CD measured results with required measurement reproducibility is optimized according to the invention, and an example in which a measurement reproducibility error is separated from a pattern of any length to estimate the true variability of pattern dimension or shape.

First, a pattern is transferred to a semiconductor wafer coated with a predetermined resist by using a mask including a large number of patterns having the same shape on the design data by the exposure device. At this time, as shown in FIG. 7, a resist pattern is formed by exposure, so that a plurality of chips 702 including the same pattern are arranged in a matrix form on a wafer 701. Next, for $N_1$ regions of the wafer on which the resist pattern is formed, a SEM image is acquired using the SEM 501 in FIGS. 5 and 6 under a plurality of conditions in which the number of scans for the same imaging region, that is, the number of frames, is variously changed. A recipe that serves as an operation program for controlling the SEM is stored in advance in the memory 506 and the storage medium 621, and the SEM 501 executes measurement processing in accordance with the operation program stored in the recipe. FIG. 10 is a flowchart showing SEM measurement processing steps. The sample 609 (wafer) is introduced into a vacuum sample chamber of the SEM 501 (step 1001). The sample stage 608 and, if necessary, the deflector for moving the field of view are controlled so that the field of view is positioned at a predetermined measurement position (step 1002).

FIG. 8 shows an example in which a plurality of fields of view 802 are set in a region 801. The region 801 is included in a chip 702 on a wafer 701, and patterns having the same shape are formed in the region 801. FIG. 8 shows an example in which 1 μm square fields of view 802 are disposed at 2 μm pitch in a region 801 (30 μm square in this example). In the region 801, line patterns having the same line width are arranged on design data. In this example, since 10 fields of view 802 are arrayed vertically and 10 fields of view 802 are arrayed horizontally, $N_1$ is 100. Based on the detection signal obtained in each field of view, the feature amounts (dimension values) of the pattern are measured. Since the number of scans is changed in chip unit as described above, when the field of view is positioned at different positions, the number of frames is also set (changed) at the same time (step 1003).

Next, measurement is executed by performing beam scanning with the set number of frames at the set field of view position (step 1004). In this embodiment, the imaging region (the field of view, the scanning region of the electron beam) includes a line and space pattern of the same design as shown in FIG. 8. FIG. 8 shows the example in which the field of view 802 is set in a line and space pattern where a line pattern 804 and a space 805 are alternately arranged. Since the cross section of the line pattern 804 is like 807 and an edge 806 thereof is formed to be angled with respect to the irradiation direction of the electron beam, the emission amount of the secondary electrons is relatively larger than other portions and is displayed with high luminance due to the edge effect.

In the present embodiment, $N_2$ length measurement regions having a predetermined measurement edge length is specified in the field of view 802, and the pattern width in the length measurement region is measured as follows. Setting of the length measurement regions (measurement regions) is realized by setting a plurality of measurement boxes 803 within the field of view 802. FIG. 8 shows the example in which nine measurement boxes 803 ($N_2$=9) are set in the field of view 802. In an image processing unit 507 or an image analysis unit 508, a plurality of signal intensity profiles (luminance distribution waveforms) are generated in the measurement box 803 along an x direction, and the dimension between peaks is measured using a threshold method, a linear approximation method, or the like. In the present embodiment, with respect to the length measurement region, a cut line is set in an edge vertical direction at plural ($N_3$) positions at regular intervals in an edge direction (y direction) of the pattern, and a signal intensity profile along the cut line is obtained. At this time, if necessary, image processing such as filtering accompanying the length measurement SEM may be performed. FIG. 9 is a diagram showing an example of generating signal intensity profiles 905 to 908 for each of the divided regions 901 to 904 divided by the cut line. In the present embodiment, the pattern dimension is calculated by applying a predetermined algorithm to the signal intensity profiles of the divided regions divided by each cut line, and the dimension measured results of all ($N_3$ (four in the example of FIG. 9)) included in the length measurement region are averaged to obtain the dimension for each measurement region. Through the above processing, one measured value is obtained for a combination of three parameters: the imaging region in the wafer, the length measurement region in the imaging region, and the number of frames.

As described above, in order to obtain the length measurement results of a plurality of length measurement regions for plurality of different numbers of frames, movement (step 1005) and measurement (step 1004) to a plurality of fields of view (FOV) or a plurality of measurement length regions are repeated. In order to perform measurement in the plurality of fields of view for different number of frames, the stage movement to different chips and the movement of the field of view (step 1006) are repeated until the measurement for pre-determined different number of plural frames (for example $N_1$) is completed.

With respect to conditions of the number of frames (Nframe), the image analysis unit 508 randomly samples Np different regions from N1·N2 length measurement regions obtained as above, to calculate the average value CD and the standard deviation LCDU of the distribution of the measured values. The process is repeated for a plurality of times, the average value CD of the distribution of the measured values and the distribution of the standard deviations LCDU are examined to obtain the variability variance σCD and σLCDU.

Figure 3B:
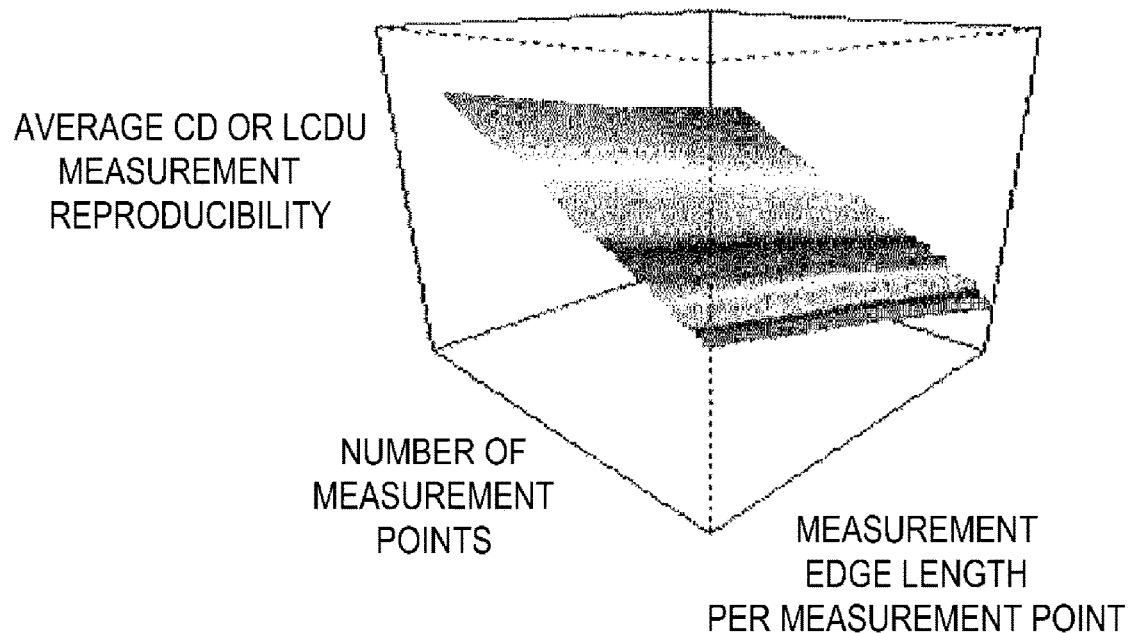

FIG. 3(b) shows dependency of σCD, σLCDU to the number of length measurement regions (N1·N2) and the number of cut lines per region (N3). Each axis in the figure is plotted with a natural logarithmic axis.

According to the investigation of the inventor, it has been found that the variance of the variability is only inversely proportional to a total number of dimension measurement points Np=N1·N2·N3, without depending on conditions such as the measurement line length. FIG. 4 shows the dependency of σCD and σLCDU to the number of length measurement regions (N1·N2) and the number of frames Nframe. The numbers attached to the curves in the figure indicate ($\sigma_{CDobserved}$ that will be described below.

As described with reference to FIG. 1, the graph is divided into the two regions of the region (region 1) that depends only on the total number of dimension measurement points without depending on the number of frames, and the region (region 2) that depends on both the total number of dimension measurement points and the number of frames (the example in FIG. 1 corresponds to the case of $N_3$=1).

Next, the image analysis unit 508 calculates the value that indicates the dependency of σCD, σLCDU on Np and Nframe by applying each of σCD, σLCDU to [Expression 9] and [Expression 10].

$$\sigma^2_{CDobserved} = \sigma^2_{CDpattern0}/(N_1 \cdot N_2) + \sigma^2_{CDsem0}/((N_1 \cdot N_2 \cdot N_3 \cdot Nframe) \cdot (I_0/Ip)) \quad \text{[Expression 9]}$$

$$\sigma^2_{LCDUobserved} = \sigma^2_{LCDUpattern0}/(N_1 \cdot N_2) + \sigma^2_{LCDUsem0}/((N_1 \cdot N_2 \cdot N_3 \cdot Nframe) \cdot (I_0/Ip)) \quad \text{[Expression 10]}$$

Here, $\sigma^2_{CDpattern0}$ is a true dimensional variability per length measurement region. $\sigma^2_{LCDUpattern0}$ is an LCDU variability per length measurement region. $\sigma^2_{CDsem0}$ is a variance of dimensional measurement errors per cut line (total number of dimension measurement points)·frame. $\sigma^2_{LCDUsem0}$ is a parameter that indicates the variance of LCDU measurement errors per cut line frame.

Since $\sigma^2_{CDobserved}$ is a value calculated by measurement and $N_1$, $N_2$, $N_3$, and Nframe are setting conditions, the image analysis unit 508 calculates $\sigma^2_{CDsem0}$ by multiple regression analysis or the like. In the case of the embodiment, the result $\sigma^2_{CDsem0}$=5 nm is obtained as the value that indicates the variance of the dimension measurement error per cut line. The image analysis unit 508 calculates $\sigma^2_{CDsem0}$ based on the stored computation expression (step 1007) and stores $\sigma^2_{CDsem0}$ in the memory 506 or the like in order to optimize the device conditions to be described below and calculate the true shape variability (step 1008). By assigning the multiple regression analysis and the like or the $\sigma^2_{CDsem0}$ calculated as described above into Expression 9, $\sigma^2_{CDpattern0}$ is also calculated and stored, and is used for optimization of the device conditions described below. By calculating $\sigma^2_{CDsem0}$ for each of a plurality of devices conditions (number of frames), $\sigma^2_{CDpattern0}$ under each device condition can be calculated.

Next, a method of optimizing the device conditions (measurement conditions and measurement sampling conditions) from $\sigma^2_{CDsem0}$ calculated as described above will be described. In this example, first, in order to secure CD measurement reproducibility accuracy, parameter adjustment is performed to satisfy conditions of [Expression 11].

$$\text{Required accuracy} > \sigma^2_{CDpattern0}/(N_1 \cdot N_2) + \sigma^2_{CDsem0}/((N_1 \cdot N_2 \cdot N_3 \cdot \text{Nframe}) \cdot (I_0/I_p)) \quad \text{[Expression 11]}$$

In a measurement optimization unit 509, a proper combination of $N_3$ and Nframe is selected to satisfy conditions of Expression 11. When the number of frames or the like is excessively increased, the throughput of the device is reduced. Thus, it is preferable to select the smallest number of frames or the like that satisfies the conditions of [Expression 11]. $\sigma^2_{CDsem0}$ may be decreased by increasing the current Ip. On the contrary, the resolution of the device or the like is lowered when the beam current Ip is increased. Thus, it is preferable to select the lowest current that satisfies the conditions of Expression 11.

It is desirable to set the device conditions such that the measurement error becomes sufficiently small as compared with the region 1 shown in FIG. 1, that is, the variability of the pattern shape and dimension. In order to satisfy this condition, the measurement optimization unit 509 sets each parameter to satisfy conditions of [Expression 12].

$$\sigma^2_{CDpattern0}/(N_1 \cdot N_2) > \sigma^2_{CDsem0}/((N_1 \cdot N_2 \cdot N_3 \cdot \text{Nframe}) \cdot (I0/I)) \quad \text{[Expression 12]}$$

In the LCDU measurement in a case where the variability of shape and dimension of the measurement object is large, like in a fine-hole pattern, it is not necessary to set the measurement condition that unnecessarily reduces the second item.

By performing device adjustment based on the above computation, high accuracy measurement with reduced measurement error can be performed.

When imaging the same FOV region with the number of frames N, by storing in a memory two-dimensional signal intensity distribution for each scanning of N scans, and properly adding them later, imaging results of the flame number 1 to N can be acquired simultaneously. In this way, it is possible to greatly reduce the number of required imaging FOVs. In other words, as shown in FIG. 10, if information of a plurality of frames can be obtained in one field of view instead of varying the number of frames in field of view unit, the number of field of view positions required for imaging can be reduced and the throughput can be improved.

Next, the measurement reproducibility error is separated to estimate the true variability of pattern dimension and shape LCDU. First, the same process as that of the CD is done for the LCDU, and a condition is set in the region 1 of the LCDU. Under this setting condition, with regard to the obtained measured result, standard deviation σCD of observed CD variability may be regarded as the true value of the LCDU. However, in a case where the measurement reproducibility error cannot be ignored, the image analysis unit 508 calculates $\sigma_{CDpattern0}$ according to [Expression 13] stored in the memory 506. $\sigma_{CDpattern0}$ is the estimated value of LCDU.

$$\sigma^2_{CDpattern0} = N_1 \cdot N_2 \cdot \sigma^2_{CDobserved} - \sigma^2_{CDsem0}/(N_3 \cdot \text{Nframe}) \cdot (I_0/I) \quad \text{[Expression 13]}$$

In this way, from the variance $\sigma^2_{observed}$ of the variability of the CD and the LCDU observation result when observed with any number of frames Nframe, the variance of the true variability of pattern dimension shape can be estimated. From the result, it is possible to estimate the dimensional variability for a pattern having any length.

The device conditions may be set as conditions that the measurement error is sufficiently small as compared with the variability of the pattern shape and dimension. However, in the case of the LCDU measurement where the variability of shape and dimension of the measurement object is large, like in the a fine-hole pattern, it is not necessary to set the measurement condition that unnecessarily reduces the second item. As described above, according to this embodiment, it is possible to properly set the imaging condition and the sampling pattern that maximize the throughput under the conditions that satisfy the required measurement accuracy according to the measurement object.

A measurement analysis output unit 510 displays the number of frames, the beam current and the like calculated as described above on, for example, the display unit of an input device 504 or the workstation 622. The operator may look at the display, and can set the device conditions. By displaying a plurality of the numbers of frames or the like that satisfy the conditions of [Expression 11] as candidates of the setting conditions, the operator may be allowed to select the device conditions. The measurement analysis output unit 510 displays the measured results calculated by [Expression 13] on the display unit. At this time, a difference from the predetermined reference value may be displayed instead of an index value such as variability, and a chart in which the degree of variability of graphs or the like can be visually determined is displayed.

The number of frames calculated as described above may be set as a device condition of the SEM.

Second Embodiment

In the above-described embodiment, the scanning electron microscope, which is a type of charged radiation beam device, has been described as an example of the imaging unit. However, for example, a focused ion beam device that generates an image by scanning a focused ion beam may be referred to as the imaging unit. The imaging unit independently stores a signal intensity distribution (image data) captured for each frame with respect to a predetermined image capturing region, repeats the signal intensity distribution for the maximum number of frames to transfer each image data to the image storage unit, and independently stores a plurality of image data with respect to the imaging region.

An image processing unit included in the imaging unit such as a scanning electron microscope or a focused ion beam device or included in a measurement device combines the plurality of image data to synthesize SEM images or SIM images of various numbers of frames. According to the method described in the first embodiment, the image analysis unit samples the length measurement region from the image, and measures the length and the variability distribution thereof as a function of the number of samplings and the number of frames to a predetermined model expression.

The measurement optimization unit outputs optimum imaging conditions and a necessary sampling plan based on the above model expression by inputting the necessary measurement reproducibility and a boundary condition such as an upper limit number of frames. The measurement optimization unit outputs the estimated value of the expected measurement error. The sampling plan is reflected in the measurement of the subsequent wafers including the wafer.

When the SEM measurement reproducibility error exceeds a predetermined range, a predetermined warning is issued since the device state of the SEM may be deviated from normal. When the variability of the pattern dimension and shape exceeds a predetermined range, the predetermined warning is issued since abnormality in the patterning process is possible. The measurement analysis output unit removes the measurement error from the observation value to calculate the true variability of dimension and shape.

Third Embodiment

The present embodiment describes an example in which the LCDU or the distribution thereof is correctly measured by the measurement method described in the first embodiment. The LCDU is measured for the same design pattern that exists in many places of the wafer surface by the method shown in Example 1 and the distribution within the wafer surface of the true dimension and shape variability is calculated fit to the expression. By feeding back the calculated results to the processing device, it is possible to reduce the above variability and improve the yield. In the present embodiment, by subtracting the measurement reproducibility error, only the true spatial variability of the object pattern shape can be evaluated.

REFERENCE SIGN LIST

501 SEM (scanning electron microscope), 502 pattern measurement device 502, 503 design data storage medium, 504 input device, 505 computation processing device, 506 memory, 601 electron source 601, 602 extraction electrode, 603 electron beam, 604 condenser lens, 605 scanning deflector, 606 objective lens, 607 vacuum sample chamber, 608 sample table, 609 sample (wafer), 610 electron, 611 secondary electron, 612 conversion electrode, 613 detector, 614 control device, 617 A/D converter, 618 image processing unit, 619 CPU, 620 image memory, 621 storage medium, 622 workstation

The invention claimed is:

1. A pattern measurement device including a computation processing device that, on a basis of a plurality of measured values acquired by a charged particle radiation device, calculates a variability of the measured values of a pattern that is an object of measurement, the pattern measurement device comprising:
a storage medium that stores the measured values of a pattern, wherein
the computation processing device is configured to calculate, using a variability $\sigma_{measured}$ of the plurality of measured values formed at different positions, and an following expression including following parameters, $\sigma_{SEM0}$ which indicates a measurement reproducibility error:

$$\sigma^2_{observed} = \sigma^2_{pattern0}/Np + \sigma^2_{sem0}/(Np \cdot Nframe) \quad \text{[Expression]}$$

[Parameters]
$\sigma_{pattern0}$: a variability due to a pattern shape error
Np: a number of measurement points
Nframe: a value that changes according to device conditions.

2. The pattern measurement device according to claim 1, wherein
the Nframe is a number of frames of the charged particle radiation device.

3. The pattern measurement device according to claim 2, wherein
the computation processing device calculates the Nframe with which $\sigma^2_{pattern0}/Np + \sigma^2_{sem0}/(Np \cdot Nframe)$ satisfies a predetermined condition.

4. The pattern measurement device according to claim 1, wherein
the computation processing device calculates a variability $\sigma^2_{CDpattern0}$ based on a following expression having following parameters:

$$\sigma^2_{CDpattern0} \cdot Np \cdot \sigma^2_{CDobserved} - \sigma^2_{CDsem0}/Nframe \quad \text{[Expression]}$$

5. The pattern measurement device according to claim 1, wherein
the plurality of measured values are values measured at different timings and different positions.

6. A storage medium that stores a computer program which is readable by a computer and which enables the computer to calculate, on a basis of a plurality of measured values acquired by a charged particle radiation device, a variability of the measured values of a pattern that is an object of measurement, wherein
the computer program causes the computer to calculate, using a variability $\sigma_{measured}$ of the plurality of measured values formed at different positions, and a following expression including following parameters, $\sigma_{SEM0}$ which indicates a measurement reproducibility error:

$$\sigma^2_{observed} = \sigma^2_{pattern0}/Np + \sigma^2_{sem0}/(Np \cdot Nframe) \quad \text{[Expression]}$$

[Parameters]
$\sigma_{pattern0}$: a variability due to a pattern shape error
Np: a number of measurement points
Nframe: a value that changes according to device parameters.

* * * * *